(12) United States Patent
Xie et al.

(10) Patent No.: US 8,395,458 B1
(45) Date of Patent: Mar. 12, 2013

(54) HIGH POWER DIRECT TRANSMITTER WITH FREQUENCY-SHIFT KEYING (FSK) MODULATION

(75) Inventors: Chenggang Xie, Marion, IA (US); Gamal M. Hegazi, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 6 days.

(21) Appl. No.: 13/239,636

(22) Filed: Sep. 22, 2011

(51) Int. Cl.
*H03C 3/06* (2006.01)

(52) U.S. Cl. ....... 332/127; 332/117; 332/136; 331/36 C; 331/17; 455/110

(58) Field of Classification Search .................. 332/117, 332/127, 128, 136; 333/25; 375/302; 331/17, 331/36 C; 455/110
See application file for complete search history.

(56) References Cited

U.S. PATENT DOCUMENTS

| 4,068,173 A * | 1/1978 | Weise | 455/118 |
| 2010/0295621 A1 * | 11/2010 | Mar | 331/18 |

* cited by examiner

*Primary Examiner* — Ryan Johnson
*Assistant Examiner* — Christian L Rivera
(74) *Attorney, Agent, or Firm* — Donna P. Suchy; Daniel M. Barbieri

(57) ABSTRACT

The present invention is a high power direct transmitter with frequency-shift keying (FSK) modulation. The transmitter implements a high power, high efficiency power voltage-controlled oscillator (VCO) which allows for production of a modulated RF signal at the final stage (ex.—right at the antenna), thereby eliminating all driving stage power amplification and frequency translation. The transmitter further provides a low SWAP-C alternative to currently available solutions.

20 Claims, 4 Drawing Sheets

HIGH POWER DIRECT TRANSMITTER WITH FREQUENCY-SHIFT KEYING (FSK) MODULATION

FIELD OF THE INVENTION

The present invention relates to the field of radio systems and particularly to a high power direct transmitter with frequency-shift keying (FSK) modulation.

BACKGROUND OF THE INVENTION

Currently available transmitter architectures may not provide a desirable level of Size, Weight, Power and Cost (SWAP-C) performance.

Thus, it would be desirable to provide a transmitter architecture which obviates problems associated with currently available solutions.

SUMMARY OF THE INVENTION

Accordingly, an embodiment of the present invention is directed to a tunable power voltage-controlled oscillator, including: a tunable resonator, the tunable resonator configured for generating a resonator output signal; a power amplifier assembly, the power amplifier assembly being connected to the tunable resonator, the power amplifier assembly configured for receiving the resonator output signal and increasing a power level of the resonator output signal to generate an amplifier output signal; and a first directional coupler, the first directional coupler being connected to the power amplifier assembly, the first directional coupler further configured for being connected to an antenna, the first directional coupler configured for receiving the amplifier output signal, routing a first portion of the amplifier output signal to the antenna, and routing a second portion of the amplifier output signal to a second directional coupler, the second directional coupler being connected to the first directional coupler and the tunable resonator, wherein the tunable resonator is configured for receiving a control signal from a transformer, the transformer connecting the resonator of the power voltage-controlled oscillator to a phase-locked loop, the control signal including a tuning voltage and modulation data stream input, the control signal configured for locking a carrier frequency of the power voltage-controlled oscillator and for providing frequency modulation.

A further embodiment of the present disclosure is directed to a transmitter (ex.—a high efficiency direct transmitter), including: a tunable power voltage-controlled oscillator (VCO); and a phase-locked loop (PLL), the PLL being connected to the VCO via a transformer, the PLL being configured for generating an output and providing the output to the transformer, the transformer being configured for receiving the PLL output, the transformer being further configured for receiving a modulation data stream, the transformer being further configured for providing a control signal to the VCO based upon the received modulation data stream and the received PLL output, the control signal including the modulation data stream and a tuning voltage, wherein the control signal combines the modulation data stream and the tuning voltage and is configured for locking a carrier frequency of the VCO and providing frequency modulation.

A still further embodiment of the present invention is directed to a method for performing frequency tuning and modulation for a transmitter, the method including: generating a RF output signal via a voltage-controlled oscillator (VCO) of the transmitter; receiving the RF output signal at a phase frequency detector of a phase-locked loop (PLL) of the transmitter; receiving a reference input signal at the phase frequency detector; comparing a phase of the received RF output signal with a phase of the received reference input signal; providing an output to a transformer of the transmitter based upon said comparison; receiving the PLL output and a modulation data stream at the transformer; combining the modulation data stream and the PLL output via the transformer to generate a control signal, the control signal including the modulated data stream and a tuning voltage; and providing the control signal to a resonator of the VCO for locking a frequency of the VCO and for providing frequency modulation (ex.—frequency-shift keying (FSK) modulation).

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Currently available transmitters may include (ex.—may implement) an architecture (ex.—a heterodyne transmitter architecture) which includes: a modulator, a mixer (ex—mixer and local oscillator (mixer/LO)) and a power amplifier (PA). In such currently available transmitters, an (in-phase signal-quadrature signal (IQ) modulator generates a desired waveform and the signal is either up-converted or down-converted to the required frequency using the mixer (ex.—mixer/LO). Finally, the signal is amplified through several stages to meet the power output requirement. For instance, at least forty decibels (40 dB) of amplification may be required for meeting a ten Watt (10 W) power output requirement. The heterodyne transmitter architecture has been utilized for many years and in almost all commercial and military communication radios. Enormous resources have been spent to reduce the size, weight, power and cost (SWAP-C) of radios. However, most improvements which have been made have been incremental. The basic architecture implemented in currently available transmitters (ex.—radio transmitters) is generally the same.

In currently available radio transmitters, a significant portion of SWAP-C is devoted to power amplification and frequency conversion (ex.—the analog process that converts a very low power intermediate frequency (IF) signal to a high power radio frequency (RF) signal so that the RF signal can drive the final stage amplifier). The conversion circuitry (excluding the final stage amplifier) of the currently available transmitters may occupy more than 50% of the board area of the transmitters. Further, the conversion circuitry may consume 15-30% of the total power used for transmitting. Excessive weight and cost are significant drawbacks for these currently available transmitters. In the present disclosure, a radio transmitter architecture is described which promotes improved SWAP-C efficiency over currently available transmitter architectures. Further, the radio transmitter architecture of the present disclosure implements a high power, high efficiency power voltage-controlled oscillator (VCO) which allows for production of a modulated RF signal at the final stage (ex.—right at the antenna), thereby eliminating all driving stage power amplification and frequency translation (and promoting reduced SWAP-C relative to currently available transmitter architectures).

Figure 1:
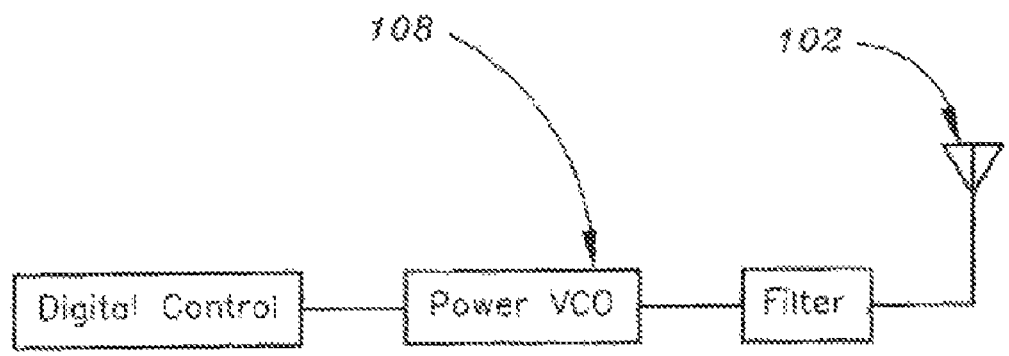
FIGS. 1 and 2 are block diagram schematics of radio system architectures in accordance with exemplary embodiments of the present disclosure.
Figure 2:
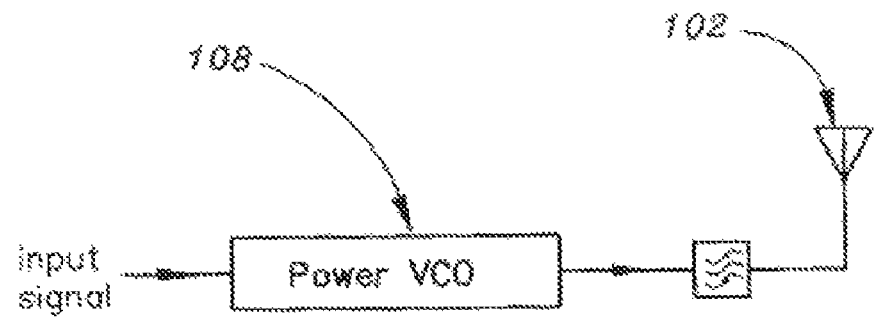

Still further, the radio transmitter architecture of the present disclosure presents a high power (ex.—20 Watts (20 W) or greater) direct radio transmitter which may provide frequency-shift keying (FSK) modulation and may significantly reduce SWAP-C of radio systems. Further, the radio transmitter architecture of the present disclosure may generate a high power, FSK waveform (or Gaussian Minimum-shift keying (GMSK) waveform) directly at the final stage before the antenna (as shown in FIGS. 1 and 2). Thus, the transmitter architecture of the present disclosure may eliminate all driver stages and the mixer, thereby achieving improved SWAP-C over currently available transmitters. For instance, the transmitter architecture of the present disclosure may provide a 40% reduction in size, a 30% reduction in weight, a 20% reduction in power and a 40% reduction in cost compared to currently available transmitter architectures.

Figure 3:
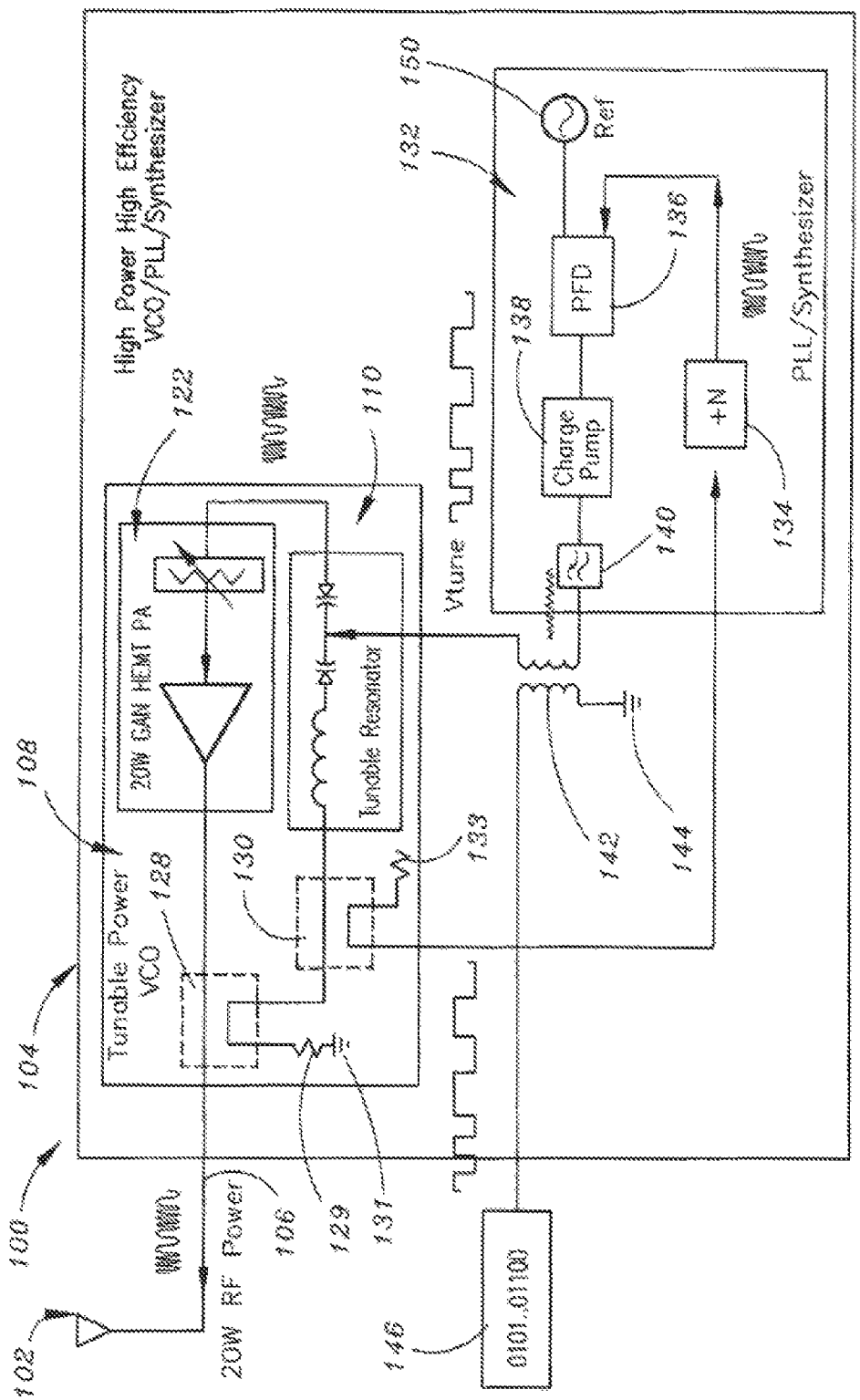
FIG. 3 is a block diagram schematic of a radio system implementing a transmitter in accordance with an exemplary embodiment of the present disclosure.

Referring to FIG. 3, a system (ex.—a radio system; communication radio equipment) 100 in accordance with an embodiment of the present disclosure, is shown. For instance, the radio system 100 may be configured for transmitting radio frequency (RF) signals. In further exemplary embodiments, the radio system 100 may also be configured for receiving RF signals. In an exemplary embodiment, the system 100 may include at least one antenna 102. The antenna 102 may be configured for transmitting (ex.—radiating) RF signals (ex.—electromagnetic energy; electromagnetic waves; radio waves). In further exemplary embodiments, the antenna 102 may also be configured for receiving RF signals.

In exemplary embodiments of the present disclosure, the radio system 100 includes a transmitter 104. The transmitter 104 may be connected to the antenna 102. For instance, the transmitter 104 may be connected to (ex.—communicatively coupled with) the antenna 102 via a transmission line 106. In an embodiment of the present disclosure, the transmitter 104 may include a voltage-controlled oscillator (VCO) (ex.—a power voltage-controlled oscillator (VCO)) 108. The power VCO 108 may be an electronic device which is configured for oscillating with varying frequency. The oscillation frequency of the VCO 108 may be controlled by a voltage input (ex.—a DC voltage which is applied to the VCO). The VCO 108 may be further configured for receiving modulating signals for causing frequency modulation.

In an embodiment of the present disclosure, the VCO 108 may include a resonator (ex.—a tunable resonator; a series resonator) 110. The resonator 110 may be a device which is configured for oscillating with varying frequency and generating a resonator output signal (ex.—electromagnetic wave; waveform). The resonator 110 may be tunable, such that the resonator 110 may have the amplitude and phase of its output controlled by a voltage input (ex.—a DC voltage which is applied to the resonator). In further embodiments, the resonator 110 is/includes an electrical circuit (ex.—resonant circuit) which includes discrete components. For instance, the resonator 110 may include: capacitors (ex.—fixed capacitors) (112, 114); varactor diodes (116, 118); and an inductor 120, each connected as part of the electrical circuit.

In exemplary embodiments of the present disclosure, the VCO 108 may further include an amplifier assembly (ex.—a power amplifier (PA) assembly) 122. The power amplifier assembly 122 may be a Gallium Nitride High-Electron-Mobility Transistor power amplifier (GAN HEMT PA) assembly 122. For instance, the power amplifier assembly 122 may be a twenty Watt (20 W), high efficiency, GAN HEMT PA assembly 122. The power amplifier assembly 122 may be connected to the resonator 110. The PA assembly 122 may be configured for receiving the output signal from the resonator 110 and amplifying the received output signal. In an exemplary embodiment, the PA assembly 122 may include an attenuator (ex.—a fixed attenuator) 124. The attenuator 124 may be configured for attenuating (ex.—reducing amplitude or power of) the received resonator output signal. In still further embodiments, the PA assembly 122 may further include an amplifier 126. The amplifier 126 may be connected to the attenuator 124 and may be configured for receiving the attenuated signal and amplifying the attenuated signal to provide adequate gain.

In an embodiment of the present disclosure, the VCO 108 may further include a first directional coupler 128 and a second directional coupler 130. The first directional coupler 128 may be connected to the power amplifier assembly 122 and may be configured for receiving the amplified signal (ex.—the VCO output signal; RF output signal) from the power amplifier assembly 122. The first directional coupler 128 may be configured for routing a first portion of the amplified signal to the antenna 102 via the transmission line 106, while routing a second portion of the amplified signal to the second directional coupler 130. The antenna 102 may be configured for receiving the first portion of amplified signal and transmitting (ex—radiating) a system output signal (ex.—an RF signal; an RF output) which is based upon (ex.—derived from) the amplified signal. For instance, the system output signal may be a 20-40 Watt, RF power signal at a carrier frequency of the VCO 108. The system output signal may further be a modulated RF signal, as will be discussed further below. In further embodiments of the present disclosure, a first sub-portion of the second portion of the amplified signal/VCO output signal may be routed by the second directional coupler 130 to the resonator 110, while a second sub-portion of the second portion of the amplified signal/VCO output signal may be routed to a phase-locked loop (PLL) (ex.—synthesizer) 132 of the transmitter 104, the PLL 132 being connected to (ex.—communicatively coupled with) the VCO 108. The PLL 132 may be an electronic circuit which serves as a control system, as will be described below. In further embodiments, the first directional coupler 128 is connected to a resistor 129, said resistor 129 being further connected to a ground 131. In still further embodiments, the second directional coupler 130 may be connected to a resistor 133.

In exemplary embodiments of the present disclosure, the PLL (ex.—PLL/synthesizer) 132 may include a frequency divider (ex.—a programmable frequency divider; a digital counter) 134. In further embodiments, the frequency divider 134 may be configured for receiving the second sub-portion of the second portion of the VCO output signal. The frequency divider 134 may further be configured for providing a frequency divider output signal based upon (ex.—derived from) the second sub-portion of the second portion of the VCO output signal. In still further embodiments, the PLL/synthesizer 132 may further include a phase detector (ex.—a phase frequency detector (PFD)) 136. The PFD 114 may be connected to (ex.—communicatively coupled with) the frequency divider 134 and may be configured for receiving the frequency divider output signal.

In embodiments of the present disclosure, the PLL 132 may include a reference input signal generator (ex.—a reference oscillator) 150 which is connected to (ex.—communicatively coupled with) the phase detector 136 and is configured for providing a reference input signal to the phase detector 136. For instance, the reference input signal generator 150 may be a crystal oscillator, which is very stable in frequency. In further embodiments of the present disclosure, the phase detector 136 receives the reference input signal and the frequency divider output signal. The phase detector 136 then compares a phase of the reference input signal to a phase of the frequency divider output signal. Based upon said comparison, the phase detector 136 provides a phase detector output signal. The phase detector output signal may be configured for causing adjustment of the oscillation frequency of the VCO 108 to promote phase matching between the VCO output signal and the reference input signal and/or to lock the frequency of the VCO output signal to the frequency of the reference input signal.

In exemplary embodiments of the present disclosure, the PLL 132 may further include a charge pump 138. The charge pump 138 may be connected to the phase detector 136 and may be configured for receiving the phase detector output signal. The charge pump 138 may be configured for providing a charge pump output signal based upon (ex.—derived from) the phase detector output signal. In further embodiments, the PLL 132 may further include a filter (ex.—a low-pass filter) 140. The filter 140 may be connected to the charge pump 138 and may be configured for receiving the charge pump output signal from the charge pump 138 and may be further configured for filtering (ex.—removing noise from) the charge pump output signal to provide a filtered charge pump output signal (ex.—a PLL output).

In embodiments of the present disclosure, the transmitter 104 may include a transformer 142. The transformer 142 may be connected to the filter 140 of the PLL 132. The transformer 142 may further be connected to a ground 144. The transformer 142 may further be connected to the resonator 110 of the VCO 108. In exemplary embodiments, the transformer 142 receives the filtered charge pump output signal from the filter 140. In further embodiments, the transformer 142 is further configured for receiving a modulation data stream input 146. The transformer 142 may be configured for generating and providing a control signal to the resonator 110 of the VCO 108, the control signal being based upon (ex.—including; combining; being derived from) the modulation data stream input 146 and the PLL output, the control signal including (ex.—combining) a tuning voltage and the modulation data stream, the control signal being configured for locking the carrier frequency of the VCO 108 and for providing frequency modulation (ex.—FSK modulation). The resonator 110 may be configured for receiving the control signal and providing a subsequent resonator output signal which is based upon the control signal.

Figure 4:
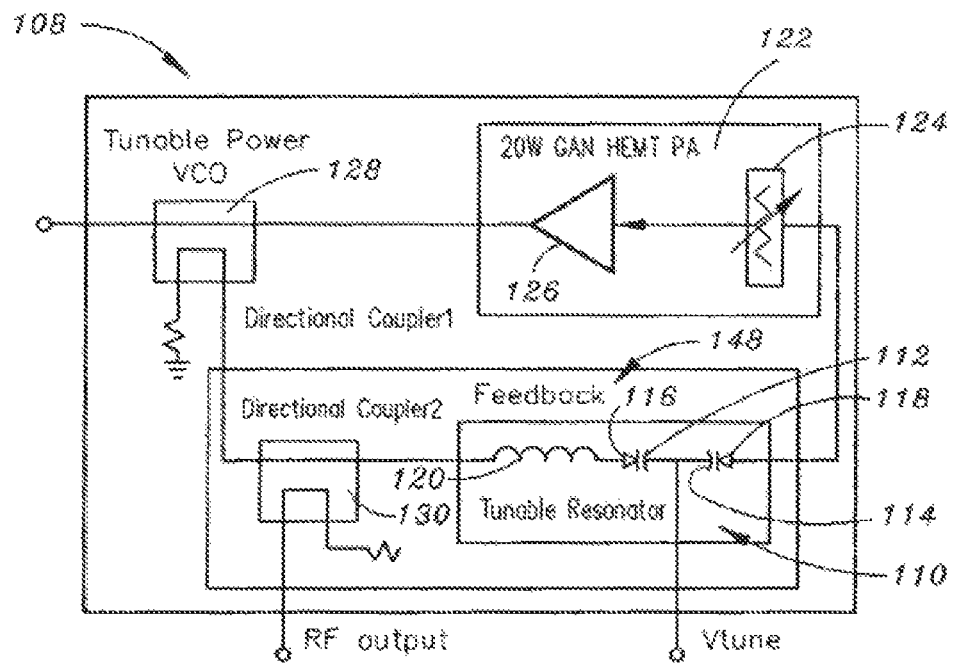
FIG. 4 is a block diagram schematic of a tunable power voltage-controlled oscillator (VCO) which may be implemented in the transmitter of the radio system shown in FIG. 3 in accordance with an exemplary embodiment of the present disclosure.
Figure 5:
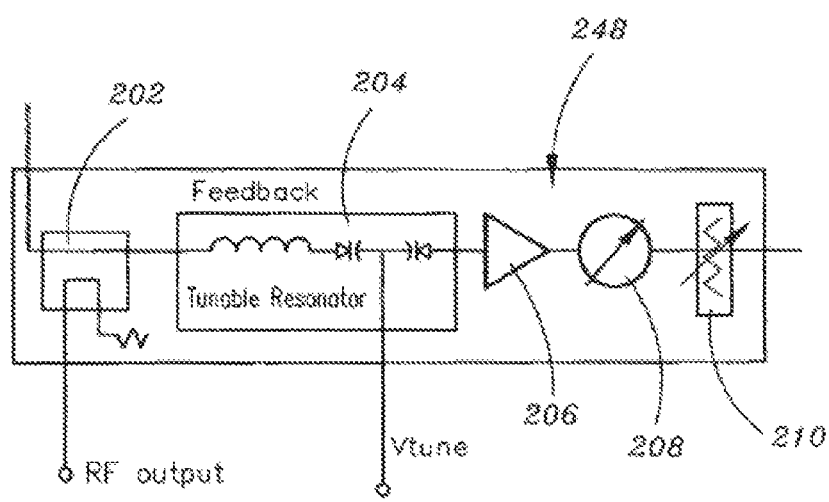
FIG. 5 is a block diagram schematic of an exemplary embodiment of a feedback circuit which may be implemented in a VCO in accordance with an embodiment of the present disclosure.

In exemplary embodiments of the present disclosure, the second directional coupler 130 and the tunable resonator 110 may be part of (ex.—may form) a feedback circuit (ex.—a positive feedback circuit) 148 (as shown in FIG. 4). In alternative embodiments, a feedback circuit 248 for implementation in a VCO of the present disclosure may include a directional coupler 202, a resonator 204, a power amplifier (PA) driver assembly 206, a phase shifter 208 and an attenuator 210 (as shown in FIG. 5). The alternative feedback circuit 248 may further tuning range and power output for the VCO.

In embodiments of the present disclosure, the first directional coupler 128 may be configured for preventing reflected signals from entering the feedback circuit 148. The coupling factor of the first directional coupler 128 may be optimized for flattening a peak gain curve as a function of tuning voltage. In further embodiments, the system 100 may achieve a power output greater than 30 Watts, with greater than fifty percent Direct Current (DC)-to-RF conversion efficiency and low phase noise. In still further embodiments, stable oscillation of the VCO 108 occurs when Phase (loopgain)=0 and dB (loopgain) is greater than zero.

Figure 6:
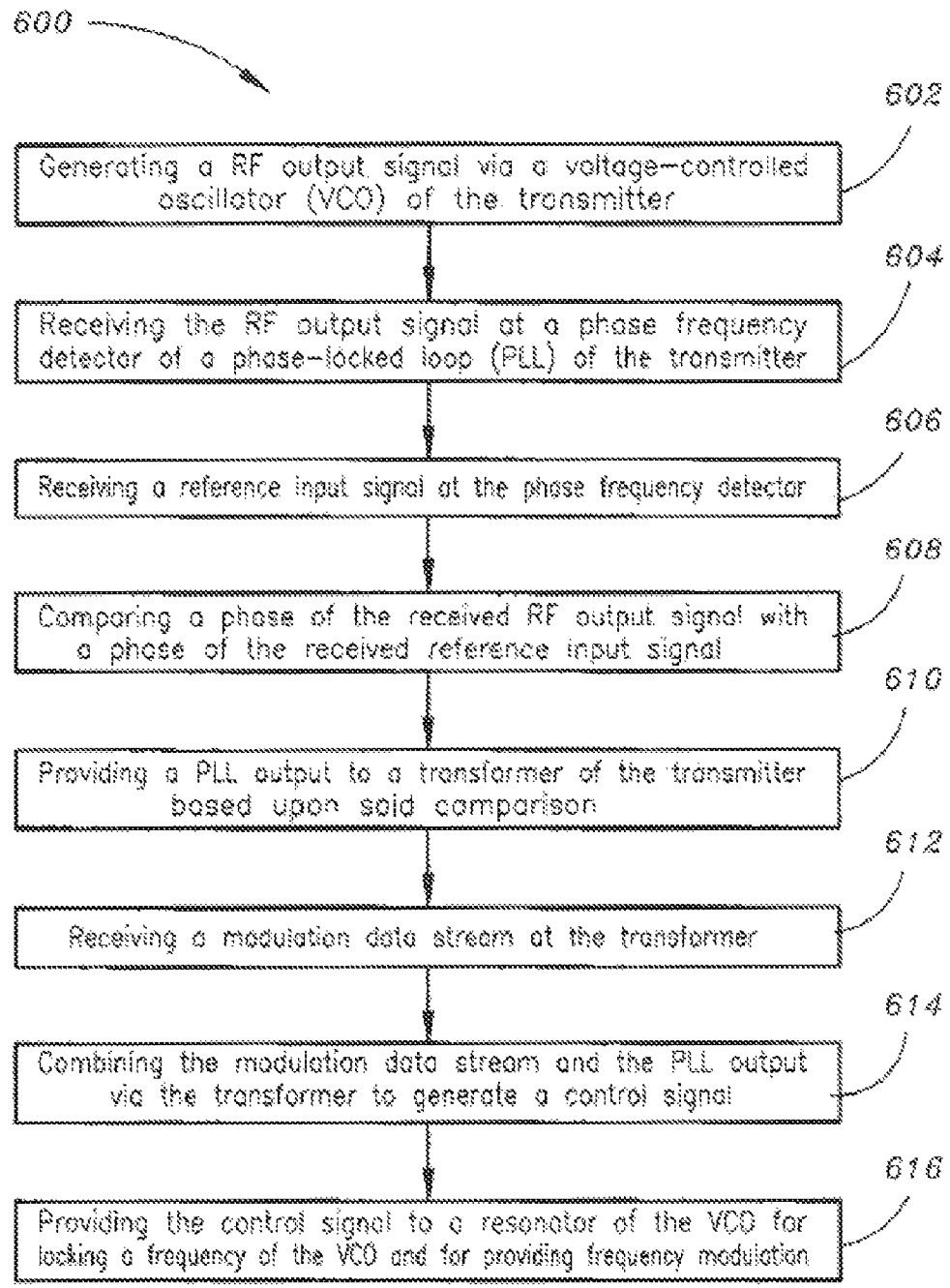
FIG. 6 depicts a flow chart illustrating a method for performing frequency tuning and modulation for a transmitter in accordance with an exemplary embodiment of the present invention.

Referring to FIG. 6, a flowchart illustrating a method for providing frequency tuning and modulation for a transmitter, such as the transmitter 104 described above, in accordance with an exemplary embodiment of the present invention is shown. The method 600 may include the step of generating a RF output signal via a voltage-controlled oscillator (VCO) of the transmitter 602. The method 600 may further include the step of receiving the RF output signal at a phase frequency detector of a phase-locked loop (PLL) of the transmitter 604. The method 600 may further include the step of receiving a reference input signal at the phase frequency detector 606. The method 600 may further include the step of comparing a phase of the received RF output signal with a phase of the received reference input signal 608. The method 600 may further include the step of providing a PLL output to a transformer of the transmitter based upon said comparison 610. The method 600 may further include the step of receiving the PLL output and a modulation data stream at the transformer 612. The method 600 may further include the step of combining the modulation data stream and the PLL output via the transformer to generate a control signal 614. The control signal may include (ex.—combine) the modulation data stream and a tuning voltage. For instance, the tuning voltage may be generated from, obtained from and/or derived from the PLL output. The method 600 may further include the step of providing the control signal to a resonator of the VCO for locking a frequency of the VCO and for providing frequency modulation 616.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A tunable power voltage-controlled oscillator (VCO), comprising:
   a tunable resonator, the tunable resonator configured for generating a resonator output signal;
   a power amplifier assembly, the power amplifier assembly being connected to the tunable resonator, the power amplifier assembly configured for receiving the resonator output signal and increasing a power level of the resonator output signal to generate an amplifier output signal; and
   a first directional coupler, the first directional coupler being connected to the power amplifier assembly, the first directional coupler further configured for being connected to an antenna, the first directional coupler configured for receiving the amplifier output signal, routing a first portion of the amplifier output signal to the antenna, and routing a second portion of the amplifier output signal to a second directional coupler, the second directional coupler being connected to the first directional coupler and the tunable resonator,
   wherein the tunable resonator is configured for receiving a control signal from a transformer, the transformer connecting the resonator of the VCO to a phase-locked loop (PLL), the control signal including a tuning voltage and modulation data stream input, the control signal configured for locking a carrier frequency of the VCO and for providing frequency modulation.

2. A tunable power voltage-controlled oscillator (VCO) as claimed in claim 1, wherein the tunable resonator includes: a plurality of fixed capacitors; a plurality of varactor diodes; and an inductor, the capacitors, varactor diodes and inductor being connected as part of an electrical circuit.

3. A tunable power voltage-controlled oscillator (VCO) as claimed in claim 1, wherein the power amplifier assembly is a 20 Watt, Gallium Nitride high-electron-mobility transistor power amplifier.

4. A tunable power voltage-controlled oscillator (VCO) as claimed in claim 1, wherein the power amplifier assembly includes an attenuator connected to an amplifier.

5. A tunable power voltage-controlled oscillator (VCO) as claimed in claim 1, wherein the frequency modulation is frequency-shift keying (FSK) modulation.

6. A tunable power voltage-controlled oscillator (VCO) as claimed in claim 1, wherein the antenna radiates a radio frequency (RF) output signal based on the received first portion of the amplifier output signal.

7. A tunable power voltage-controlled oscillator (VCO) as claimed in claim 1, wherein the second directional coupler and the tunable resonator form a feedback circuit for the VCO.

8. A tunable power voltage-controlled oscillator (VCO) as claimed in claim 7, wherein the feedback circuit further includes: a power amplifier driver; a phase shifter; and an attenuator, the power amplifier driver being connected to the tunable resonator, the phase shifter being connected to the power amplifier driver and the attenuator being connected to the phase shifter and the power amplifier assembly.

9. A transmitter, comprising:
   a tunable power voltage-controlled oscillator (VCO);
   a transformer, the transformer being connected to the VCO; and
   a phase-locked loop (PLL), the PLL being connected to the VCO via the transformer, the PLL being configured for generating an output and providing the PLL output to the transformer, the transformer being configured for receiving the output from the PLL, the transformer being further configured for receiving a modulation data stream, the transformer being further configured for providing a control signal to the VCO based upon the received output from the PLL and the received modulation data stream, the control signal including the modulation data stream and a tuning voltage,
   wherein the control signal combines the modulation data stream and the tuning voltage and is configured for locking a carrier frequency of the VCO and providing frequency modulation.

10. A transmitter as claimed in claim 9, wherein the VCO includes:
    a tunable resonator, the tunable resonator configured for generating a resonator output signal;
    a power amplifier assembly, the power amplifier assembly being connected to the tunable resonator, the power amplifier assembly configured for receiving the resonator output signal and increasing a power level of the resonator output signal to generate an amplifier output signal; and
    a first directional coupler, the first directional coupler being connected to the power amplifier assembly, the first directional coupler further configured for being connected to an antenna, the first directional coupler configured for receiving the amplifier output signal, routing a first portion of the amplifier output signal to the antenna, and routing a second portion of the amplifier output signal to a second directional coupler, the second directional coupler being connected to the first directional coupler and the tunable resonator, the second directional coupler configured for routing a first sub-portion of the second portion of the amplifier output signal to the resonator and routing a second sub-portion of the second portion of the amplifier output signal to the PLL,
    wherein the tunable resonator is configured for receiving the control signal from the transformer.

11. A transmitter as claimed in claim 10, wherein the tunable resonator includes: a plurality of fixed capacitors; a plurality of varactor diodes; and an inductor, the capacitors, varactor diodes and inductor being connected as part of a electrical circuit.

12. A transmitter as claimed in claim 10, wherein the power amplifier assembly is a 20 Watt, Gallium Nitride high-electron-mobility transistor power amplifier.

13. A transmitter as claimed in claim 10, wherein the power amplifier assembly includes an attenuator connected to an amplifier.

14. A transmitter as claimed in claim 10, wherein the frequency modulation is frequency-shift keying (FSK) modulation.

15. A transmitter as claimed in claim 10, wherein the antenna radiates a radio frequency (RF) output signal based on the received first portion of the amplifier output signal.

16. A transmitter as claimed in claim 10, wherein the second directional coupler and the tunable resonator form a feedback circuit for the VCO.

17. A transmitter as claimed in claim 16, wherein the feedback circuit further includes: a power amplifier driver; a phase shifter; and an attenuator, the power amplifier driver being connected to the tunable resonator, the phase shifter being connected to the power amplifier driver and the attenuator being connected to the phase shifter and the power amplifier assembly.

18. A transmitter as claimed in claim 10, wherein the PLL includes:
- a frequency divider, the frequency divider configured for receiving the second sub-portion of the second portion of the amplifier output signal, the frequency divider configured for generating a frequency divider output signal based upon the second sub-portion of the second portion of the amplifier output signal;
- a phase frequency detector (PFD), the PFD being connected to the frequency divider, the PFD being connected to a reference input signal generator, the PFD configured for receiving the frequency divider output signal, the PFD further configured for receiving a reference input signal from the reference input signal generator, the PFD further configured for comparing a phase of the reference input signal to a phase of the frequency divider output signal, the PFD being further configured for providing a phase detector output signal based upon said comparison, the phase detector output signal being configured for: causing adjustment of an oscillation frequency of the VCO; promoting phase matching between the amplifier output signal and the reference input signal; and locking a frequency of the amplifier output signal to a frequency of the reference input signal;
- a charge pump, the charge pump being connected to the PFD, the charge pump being configured for receiving the phase detector output signal and generating a charge pump output signal based upon the phase detector output signal; and
- a filter, the filter being connected to the charge pump, the filter configured for receiving the charge pump output signal and for removing noise from the charge pump output signal to provide the PLL output to the transformer, the PLL output being a filtered charge pump output signal.

19. A method for performing frequency tuning and modulation for a transmitter, the method comprising:
- generating a RF output signal via a voltage-controlled oscillator (VCO) of the transmitter;
- receiving the RF output signal at a phase frequency detector of a phase-locked loop (PLL) of the transmitter;
- receiving a reference input signal at the phase frequency detector;
- comparing a phase of the received RF output signal with a phase of the received reference input signal;
- providing an output from the PLL to a transformer of the transmitter based upon said comparison;
- receiving a modulation data stream at the transformer;
- combining the modulation data stream and the PLL output via the transformer to generate a control signal, the control signal including the modulation data stream and a tuning voltage; and
- providing the control signal to a resonator of the VCO for locking a frequency of the VCO and for providing frequency modulation.

20. A method for frequency tuning and modulation as claimed in claim 19, wherein the frequency modulation is frequency-shift keying (FSK) modulation.

\* \* \* \* \*